US009589823B2

(12) United States Patent
Sasaki et al.

(10) Patent No.: US 9,589,823 B2
(45) Date of Patent: Mar. 7, 2017

(54) MOUNTING TABLE AND PLASMA PROCESSING APPARATUS

(71) Applicant: TOKYO ELECTRON LIMITED, Tokyo (JP)

(72) Inventors: Yasuharu Sasaki, Miyagi (JP); Takeshi Sugamata, Miyagi (JP); Tadashi Aoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 287 days.

(21) Appl. No.: 14/367,058

(22) PCT Filed: Dec. 17, 2012

(86) PCT No.: PCT/JP2012/082681
§ 371 (c)(1),
(2) Date: Jun. 19, 2014

(87) PCT Pub. No.: WO2013/094564
PCT Pub. Date: Jun. 27, 2013

(65) Prior Publication Data
US 2014/0346152 A1    Nov. 27, 2014

Related U.S. Application Data

(60) Provisional application No. 61/580,855, filed on Dec. 28, 2011.

(30) Foreign Application Priority Data

Dec. 20, 2011 (JP) ................................. 2011-278411

(51) Int. Cl.
*B23K 10/00* (2006.01)
*H01L 21/683* (2006.01)
(Continued)

(52) U.S. Cl.
CPC .... *H01L 21/6833* (2013.01); *H01J 37/32091* (2013.01); *H01J 37/32715* (2013.01);
(Continued)

(58) Field of Classification Search
CPC ............. H01L 21/6833; H01L 21/6831; H01L 21/3065; H01J 2221/83; H01J 37/32091; H01J 37/32715; H05H 1/30; H05H 1/466
(Continued)

(56) References Cited

U.S. PATENT DOCUMENTS 9,240,340 B2 *  1/2016  Shiraiwa ............. H01L 21/6833
2007/0256786 A1 * 11/2007  Zhou ................. H01J 37/32477
156/345.34

(Continued)

FOREIGN PATENT DOCUMENTS

JP    7-183279 A    7/1995
JP    2008-85329 A    4/2008
JP    4095842 B2    6/2008

OTHER PUBLICATIONS

International Search Report mailed Mar. 19, 2014 in PCT/JP2012/082681.

*Primary Examiner* — Mark Paschall
(74) *Attorney, Agent, or Firm* — Rothwell, Figg, Ernst & Manbeck, P.C.

(57) ABSTRACT

A mounting table includes an electrostatic chuck, a base, and a cylindrical sleeve. The electrostatic chuck has a top surface to be exposed to plasma and a bottom surface opposite to the top surface, and a first through-hole is formed through the electrostatic chuck. The base is bonded to the bottom surface of the electrostatic chuck by a first adhesive, and a second through-hole is formed through the base. The second through-hole communicates with the first through-hole and has a diameter larger than a diameter of the first through-hole. The sleeve is bonded to the bottom surface of the
(Continued)

electrostatic chuck by a second adhesive while communicating with the first through-hole.

12 Claims, 6 Drawing Sheets

(51) Int. Cl.
*H01L 21/3065* (2006.01)
*H01J 37/32* (2006.01)

(52) U.S. Cl.
CPC ...... *H01L 21/3065* (2013.01); *H01L 21/6831* (2013.01); *H01L 2221/683* (2013.01)

(58) Field of Classification Search
USPC ............... 219/121.43, 121.58; 118/724, 725; 156/345.52, 345.51, 345.53
See application file for complete search history.

(56) References Cited

U.S. PATENT DOCUMENTS

| | | | |
|---|---|---|---|
| 2008/0083724 A1 | 4/2008 | Tsukamoto | |
| 2010/0304571 A1* | 12/2010 | Larson | H01L 21/67103 438/710 |
| 2011/0005686 A1* | 1/2011 | Tanaka | H01L 21/68757 156/345.52 |
| 2011/0162799 A1* | 7/2011 | Hayashi | H01J 37/32091 156/345.33 |

* cited by examiner

MOUNTING TABLE AND PLASMA PROCESSING APPARATUS

CROSS REFERENCE TO RELATED APPLICATION

This application is a 35 U.S.C. 371 National Phase Entry Application from PCT/JP2012/082681, filed Dec. 17, 2012, which claims the benefit of U.S. Provisional Application No. 61/580,855, filed Dec. 28, 2011 and Japanese Patent Application No. 2011-278411, filed Dec. 20, 2011, the disclosures of which are incorporated herein in their entirety by reference.

FIELD OF THE INVENTION

Various aspects and embodiments of the present invention relate to a mounting table and a plasma processing apparatus.

BACKGROUND OF THE INVENTION

A plasma processing apparatus includes a processing chamber that can be maintained under a vacuum atmosphere. Generally, a substrate to be processed is provided at a lower portion in the processing chamber (processing space) and processed by a plasma generated by an RF power. Therefore, the plasma processing apparatus is configured to fulfill various functions including a function of holding the substrate to be processed in the processing space, a function of supplying a power to the substrate to be processed, and the like.

Patent Document 1 discloses, as a structure that satisfies the above-described various functions, a multi-structure including: a cylindrical or rectangular processing chamber including therein a processing space, the processing chamber having a surface made of a conductive material, e.g., alumite-treated aluminum; a cylindrical base fixed to a lower portion in the processing chamber through an insulating member, e.g., an insulating plate made of ceramic; a disc-shaped heater fixing base mounted on a top surface of the base; and a mounting table covering the heater fixing base from the top and also serving as an electrode to which an RF power is supplied from the bottom. In addition, there is disclosed a structure including, as a disc-shaped chuck portion for holding a substrate to be processed on a protruded upper central portion thereof, an electrostatic chuck having a diameter substantially equal to or preferably slightly smaller than a diameter of the substrate to be processed.

Patent Document 2 discloses a structure in which a substrate base that can be controlled to a first set temperature and a substrate support to which one or more heating elements for heating the substrate support to a second set temperature higher than the first set temperature are coupled are adhesively bonded together by an erosion resistant insulating material made of an acrylic material.

Patent Document 3 discloses a structure in which a through-hole penetrating through a base and an electrostatic chuck is formed to flow a heat transfer gas between a top surface of a mounting table and a backside of a substrate and an insulating sleeve is adhered to a sidewall of the through-hole.

Patent Document 1: Japanese Patent Application Publication No. H7-183279
Patent Document 2: Japanese Patent Application Publication No. 2008-85329
Patent Document 3: Japanese Patent No. 4095842

As described above, the mounting table is formed by assembling structural members for realizing various functions and is directly exposed to a plasma or radicals generated during the plasma processing. Generally, when an adhesive for adhesively bonding the members, such as an erosion resistance insulating material made of an acrylic material, is exposed to the plasma or the radicals, the components of the adhesive are damaged. Accordingly, the adhesive may be worn or the adhesive strength thereof may deteriorate. Particularly, if the adhesive used for adhesive bonding of the electrostatic chuck is worn or deteriorates, it is difficult to control heat conductance to the members coupled to the electrostatic chuck. As a result, it is difficult to perform processing uniformly and accurately over the surface of the substrate.

SUMMARY OF THE INVENTION

Therefore, in this technical field, there is a need to develop a mounting table capable of preventing deterioration of an adhesive used for adhesive bonding of an electrostatic chuck and a plasma processing apparatus including the mounting table.

In accordance with an aspect of the present invention, there is provided a mounting table including: an electrostatic chuck, a base and a tubular sleeve. The electrostatic chuck has a top surface to be exposed to a plasma and a bottom surface opposite to the top surface, and a first through-hole is formed through the electrostatic chuck. The base is bonded to the bottom surface of the electrostatic chuck by a first adhesive, and a second through-hole communicating with the first through-hole and having a diameter larger than a diameter of the first through-hole is formed through the base. The sleeve is bonded to the bottom surface of the electrostatic chuck by a second adhesive while communicating with the first through-hole.

In the mounting table in accordance with the aspect of the present invention, the second through-hole formed in the base has a diameter greater than that of the first through-hole formed in the electrostatic chuck, so that the sleeve can be bonded to the bottom surface of the electrostatic chuck by the adhesive in the state that the first and the second through hole communicate with each other. At this time, the electrostatic chuck and the base are adhered to each other by the first adhesive, and the electrostatic chuck and the sleeve are adhered to each other by the second adhesive. In other words, the plasma or the radicals introduced through the first through-hole or the second through-hole are blocked by the sleeve, so that the first adhesive, i.e., the adhesive used for adhesive bonding of the electrostatic chuck, can be prevented from being directly exposed to the plasma or the radicals. Further, since the second adhesive is used for bonding of the sleeve, the first adhesive which bonds the electrostatic chuck and the sleeve can be prevented from being directly exposed to the plasma or the radicals. Accordingly, the mounting table in accordance with the above aspect of the present invention can prevent deterioration of the adhesive used for adhesive bonding of the electrostatic chuck.

In one embodiment, the sleeve may have an inner diameter equal to the diameter of the first through-hole and may be bonded to the bottom surface of the electrostatic chuck so as to be coaxial with the first through-hole. With such configuration, the first through-hole and the sleeve can form a through-hole having a continuous contact portion. Therefore, the through-hole can be used as a gas channel having a reduced resistance loss, for example.

In one embodiment, the first adhesive may be provided only at a contact portion between the electrostatic chuck and the base. With such configuration, the first adhesive is not used on the bottom surface of the electrostatic chuck facing the second through-hole. Therefore, the sleeve may be bonded to any position on the bottom surface of the electrostatic chuck and, also, the direct exposure of the first adhesive to the plasma or the radicals can be further prevented.

In one embodiment, the sleeve may have an outer diameter smaller than the second through-hole. With such configuration, the sleeve can be properly disposed in the second through-hole. Here, in one embodiment, the mounting table may further include a sealant filled in a space defined by the sleeve and the second through-hole. With such configuration, the radicals that have been introduced into the space defined by the sleeve and the second through-hole after moving around the sleeve can be blocked by the sealant. Accordingly, the deterioration of the first adhesive by the radicals can be reliably prevented.

In one embodiment, the sealant may be filled in the space by flowing into the space and then being cured. In this case, the sealant can be easily filled in the space.

In one embodiment, the sealant may have a viscosity of 20000 cps or less before curing and a Young's Modulus of 1 MPa or less after the curing. In this case, before the curing, the sealant can be filled in the space defined by the sleeve and the second through-hole. After the curing, the sealant can remain in the space while being deformed in response to the thermal expansion of the base and the sleeve.

In one embodiment, the sleeve may be made of the same insulating material as an insulating material of the electrostatic chuck. With such configuration, the sleeve can have a high resistance to the plasma or the radicals, similar to the electrostatic chuck. In one embodiment, the sleeve may be made of ceramic.

In one embodiment, the first adhesive may be an organic adhesive. With such configuration, the electrostatic chuck and the base can be adhesively bonded to each other in a state where a difference of deformation between the electrostatic chuck and the base is absorbed by the first adhesive having elasticity.

In one embodiment, the second adhesive may be an inorganic adhesive. Since the inorganic adhesive has a heat resistance, the deterioration of the adhesive used for adhesive bonding of the insulating sleeve can be prevented.

In one embodiment, the second adhesive may have a higher resistance to plasma or radicals than that of the first adhesive. With such configuration, it is possible to prevent deterioration of the adhesive used for adhesive bonding of the insulating sleeve and directly exposed to the plasma or the radicals.

A plasma processing apparatus in accordance with another aspect of the present invention includes a processing chamber, a gas supply unit, a first electrode and a mounting table. The processing chamber includes therein a processing space in which a plasma is to be generated. The gas supply unit supplies a processing gas into the processing space. The first electrode is provided in the processing space. The mounting table is accommodated in the processing chamber and serves to mount thereon a substrate. Here, the mounting table includes an electrostatic chuck, a base and a tubular sleeve. The electrostatic chuck has a top surface to be exposed to a plasma and a bottom surface opposite to the top surface, and a first through-hole is formed through the electrostatic chuck. The base is bonded to the bottom surface of the electrostatic chuck by a first adhesive, and a second through-hole communicating with the first through-hole and having a diameter larger than a diameter of the first through-hole is formed through the base. The sleeve is bonded to the bottom surface of the electrostatic chuck by a second adhesive while communicating with the first through-hole.

The plasma processing apparatus includes the mounting table capable of preventing deterioration of the adhesive used for adhesive bonding of the electrostatic chuck, and thus can stably operate.

EFFECT OF THE INVENTION

In accordance with various aspects and embodiments of the present invention, it is possible to provide a mounting table capable of preventing deterioration of an adhesive used for adhesive bonding of an electrostatic chuck.

DETAILED DESCRIPTION OF THE EMBODIMENTS

Hereinafter, embodiments of the present invention will be described in detail with reference to the accompanying drawings. Further, like reference numerals will be used for like or corresponding parts throughout the drawings.

Figure 1:
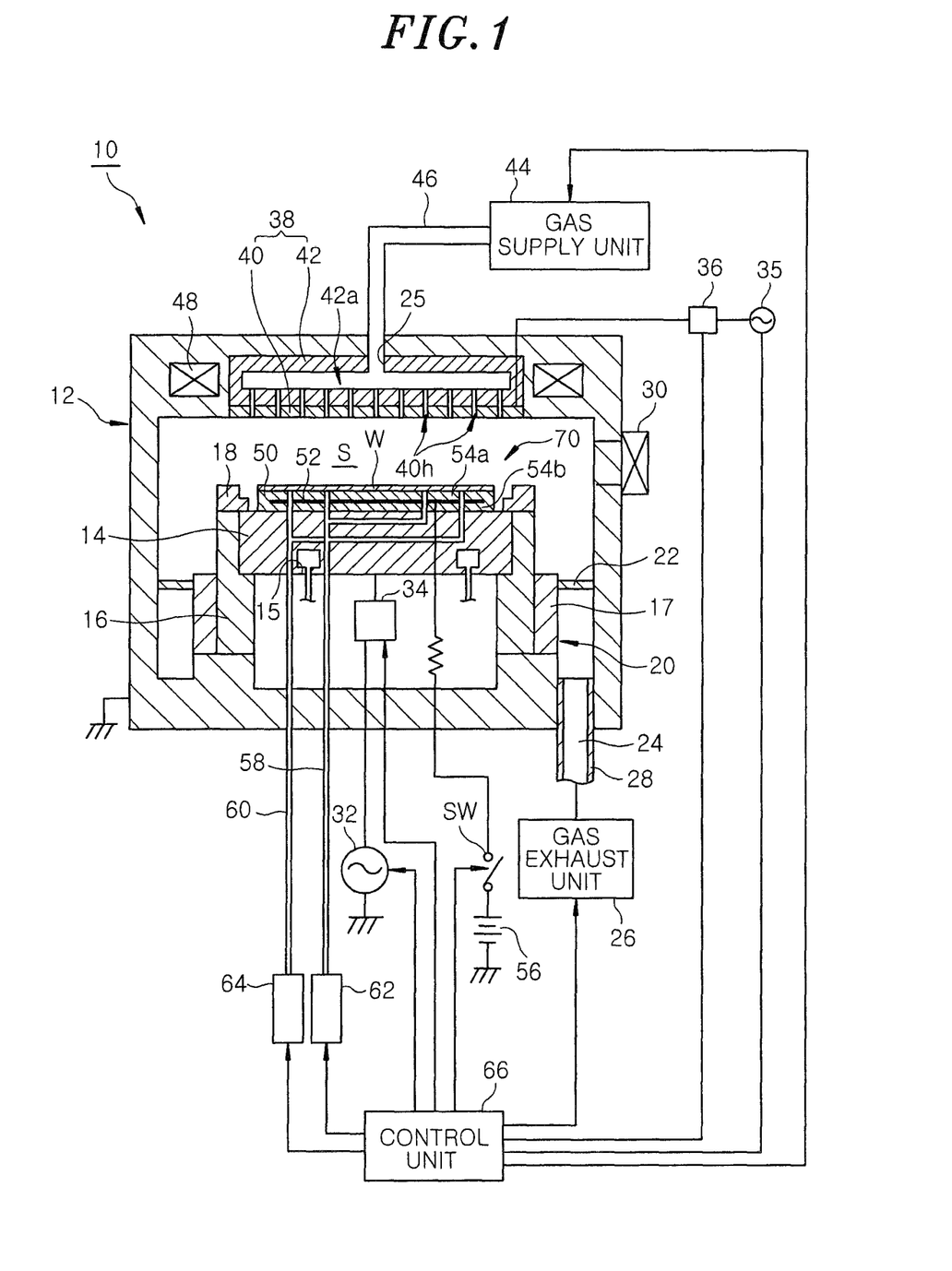
FIG. 1 schematically shows a plasma processing apparatus in accordance with an embodiment of the present invention.

FIG. 1 schematically shows a plasma processing apparatus in accordance with an embodiment of the present invention. Referring to FIG. 1, there is illustrated a cross section of the plasma processing apparatus in accordance with the embodiment of the present invention. A plasma processing apparatus 10 shown in FIG. 1 is a parallel plate type plasma processing apparatus.

The plasma processing apparatus 10 includes a processing chamber 12. The processing chamber 12 is formed in a substantially cylindrical shape and has a processing space S therein. The plasma processing apparatus 10 includes a substantially disc-shaped base 14 within the processing chamber 12. The base 14 is disposed below the processing space S. The base 14 is made of, e.g., aluminum, and serves as a second electrode. The base 14 has a function of cooling an electrostatic chuck 50 to be described later by absorbing heat of the electrostatic chuck 50 during processing.

A coolant path 15 is formed in the base 14. A coolant inlet line and a coolant outlet line are connected to the coolant path 15. By circulating a coolant, e.g. cooling water or the like, through the coolant path 15, the base 14 and the electrostatic chuck 50 can be controlled to a predetermined temperature.

In the present embodiment, the plasma processing apparatus 10 further includes a cylindrical holder 16 and a cylindrical support 17. The cylindrical holder 16 holds the base 14 by contacting with a side surface of the base 14 and a peripheral portion of a bottom surface of the base 14. The cylindrical support 17 extends in a vertical direction from the bottom portion of the processing chamber 12 and supports the base 14 through the cylindrical holder 16. The plasma processing apparatus 10 further includes a focus ring 18 mounted on a top surface of the cylindrical holder 16. The focus ring 18 is made of, e.g., silicon or quartz.

In the present embodiment, a gas exhaust line 20 is formed between a sidewall of the processing chamber 12 and the cylindrical support 17. A baffle plate 22 is provided at an inlet or in the middle of the gas exhaust line 20. A gas exhaust port 24 is provided at a lower portion of the gas exhaust line 20. The gas exhaust port 24 is formed by a gas exhaust pipe 28 inserted to the bottom portion of the processing chamber 12. A gas exhaust unit 26 is connected to the gas exhaust pipe 28. The gas exhaust unit 26 includes a vacuum pump and thus can reduce a pressure in the processing space S within the processing chamber 12 to a predetermined vacuum level. Provided on the sidewall of the processing chamber 12 is a gate valve 30 for opening/closing a loading/unloading port for a substrate W to be processed.

A high frequency power supply 32 for plasma generation is electrically connected to the base 14 via a matching unit 34. The high frequency power supply 32 applies a high frequency power having a predetermined high frequency (e.g., 27 MHz or above) to the second electrode, i.e., the base 14.

The plasma processing apparatus 10 further includes a shower head 38 within the processing chamber 12. The shower head 38 is disposed above the processing space S. The shower head 38 has an electrode plate 40 and an electrode holder 42.

The electrode plate 40 is a substantially disc-shaped conductive plate and serves as a first electrode. A high frequency power supply 35 for plasma generation is electrically connected to the electrode plate 40 via a matching unit 36. The high frequency power supply 35 applies a high frequency power having a predetermined high frequency (e.g., 27 MHz or above) to the electrode plate 40. When the high frequency powers are respectively applied to the base 14 and the electrode plate 40 by the high frequency power supplies 32 and 35, a high frequency electric field is generated in a space between the base 14 and the electrode plate 40, i.e., in the processing space S.

A plurality of gas vent holes 40h is formed in the electrode plate 40. The electrode plate 40 is detachably held by the electrode holder 42. A buffer space 42a is formed in the electrode holder 42. The plasma processing apparatus 10 further includes a gas supply unit 44. The gas supply unit 44 is connected to the gas inlet port 25 of the buffer space 42a via a gas supply conduit 46. The gas supply unit 44 supplies a processing gas into the processing space S. The gas supply unit 44 can supply, e.g., a CF-based etching gas or the like. A plurality of holes connected to the gas vent holes 40h is formed in the electrode holder 42. The holes communicate with the buffer space 42a. Accordingly, the gas supplied from the gas supply unit 44 is supplied into the processing space S through the buffer space 42a and the gas vent holes 40h.

In the present embodiment, a magnetic field forming mechanism 48 extending annularly or concentrically is provided at a ceiling portion of the processing chamber 12. The magnetic field forming mechanism 48 makes easy the start of high frequency electric discharge (plasma ignition) in the processing space S and stably maintains the electric discharge.

In the present embodiment, the electrostatic chuck 50 is provided on the top surface of the base 14. The electrostatic chuck 50 is a substantially disc-shaped member having a top surface exposed to a plasma and a bottom surface opposite to the top surface. The electrostatic chuck 50 has an electrode 52 and a pair of insulating films 54a and 54b. The insulating films 54a and 54b are made of an insulating material such as ceramic or the like. The electrode 52 is a conductive film disposed between the insulating films 54a and 54b. A DC power supply 56 is connected to the electrode 52 via a switch SW. When a DC voltage is applied from the DC power supply 56 to the electrode 52, a Coulomb force is generated. The substrate W is attracted to and held on the electrostatic chuck 50 by the Coulomb force. A heater 53 as a heating device is buried in the electrostatic chuck 50 and heats the substrate W to a predetermined temperature. The heater 53 is connected to a heater power supply through a wiring. The base 14 and the electrostatic chuck 50 form the mounting table 70.

In the present embodiment, the plasma processing apparatus 10 further includes gas supply lines 58 and 60 and heat transfer gas supply units 62 and 64. The heat transfer gas supply unit 62 is connected to the gas supply line 58. The gas supply line 58 extends to the top surface of the electrostatic chuck 50 and extends annularly at a central portion of the top surface. The heat transfer gas supply unit 62 supplies a heat transfer gas, e.g., He gas, to a gap between the top surface of the electrostatic chuck 50 and the substrate W. The heat transfer gas supply unit 64 is connected to the gas supply line 60. The gas supply line 60 extends to the top surface of the electrostatic chuck 50 and extends annularly at the top surface so as to surround the gas supply line 58. The heat transfer gas supply unit 64 supplies a heat transfer gas, e.g., He gas, to the gap between the top surface of the electrostatic chuck 50 and the substrate W.

In the present embodiment, the plasma processing apparatus 10 further includes a control unit 66. The control unit 66 is connected to the gas exhaust unit 26, the switch SW, the high frequency power supply 32, the matching unit 34, the high frequency power supply 35, the matching unit 36, the gas supply unit 44, and the heat transfer gas supply units 62 and 64. The control unit 66 transmits control signals to the gas exhaust unit 26, the switch SW, the high frequency power supply 32, the matching unit 34, the high frequency power supply 35, the matching unit 36, the gas supply unit 44, and the heat transfer gas supply units 62 and 65. With the control signals from the control unit 66, gas exhausting by the gas exhaust unit 26, opening and closing of the switch SW, power supply from the high frequency power supply 32, impedance control of the matching unit 34, power supply from the high frequency power supply 35, impedance control of the matching unit 36, processing gas supply from the gas supply unit 44, and heat transfer gas supply from the heat transfer gas supply units 62 and 64 are controlled.

In the plasma processing apparatus 10, the processing gas is supplied from the gas supply unit 44 to the processing space S. A high frequency electric field is generated between the electrode plate 40 and the base 14, i.e., in the processing space S. Accordingly, a plasma is generated in the processing space S, and the substrate W is etched by radicals (e.g., oxygen radicals) of elements contained in the processing gas and the like.

Figure 2:
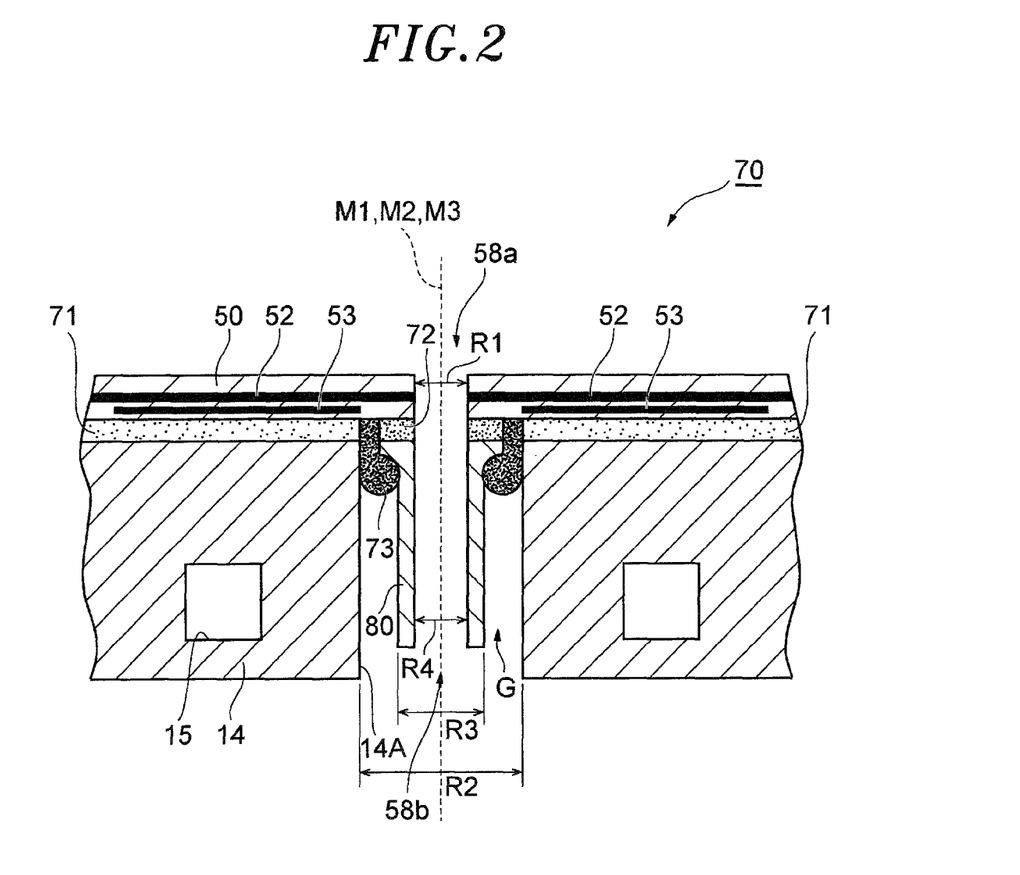
FIG. 2 is a partial cross sectional view showing a formation position of a gas supply line of a mounting table in accordance with an embodiment of the present invention.

Hereinafter, a structure of the mounting table 70 will be described in detail. FIG. 2 is a partial cross sectional view showing the formation position of the gas supply line 58 of the mounting table 70 shown in FIG. 1. As shown in FIG. 2, in the mounting table 70, the bottom surface of the electrostatic chuck 50 is adhesively bonded to the top surface of the base 14 by a first adhesive 71. The first adhesive 71 may be provided only at a contact portion (contact surface) between the electrostatic chuck 50 and the base 14.

The first adhesive 71 has a function of absorbing a difference in deformation between the base 14 and the electrostatic chuck 50 which have different linear expansion coefficients. Therefore, the first adhesive 71 has high elasticity. Further, the first adhesive 71 has a function of transferring heat of the electrostatic chuck 50 to the base 14 and a function of electrically insulating the electrostatic chuck 50 and the base 14. Accordingly, the first adhesive 71 has high thermal conductivity and electric resistivity. As for the first adhesive 71, it is possible to use, e.g., an organic adhesive including a silicon-based material, an acrylic-based or acrylate-based material, or a polyimide silica-based material. The first adhesive 71 may have the following physical properties.

(1) adhesive strength: about 1 to 10 MPa (room temperature), about 0.5 to 5 MPa (150° C.)
(2) elasticity: about 100 to 300 MPa (room temperature), about 0.1 to 2 MPa (150° C.)
(3) thermal conductivity: 0.2 W/m·K or above
(4) volume resistivity: 1e+13 Ω·cm or above (room temperature), 1e+8 Ω·cm or above (150° C.)

The gas supply line 58 includes an upper and a lower gas supply line 58$a$ and 58$b$ which penetrate the mounting table 70 in a thickness direction of the electrostatic chuck 50. A first through-hole with a diameter R1 is formed in the electrostatic chuck 50 so as to penetrate therethrough in the thickness direction. The first through-hole forms the upper gas supply line 58$a$. Meanwhile, a second through-hole with a diameter R2 is formed in the base 14 so as to penetrate therethrough in the thickness direction. The second through-hole forms the lower gas supply line 58$b$. The electrostatic chuck 50 and the base 14 are arranged such that the first through-hole and the second through-hole communicate with each other. Accordingly, the upper and the lower gas supply line 58$a$ and 58$b$ form a through-hole. For example, the electrostatic chuck 50 and the base 14 are arranged such that an axis line M1 (central axis) of the first through-hole and an axis line M2 (central axis) of the second through-hole coincide with each other, i.e., such that the axis lines M1 and M2 are coaxially arranged. The diameter R1 of the first through-hole is slightly smaller than the diameter R2 of the second through-hole. In other words, the diameter of the upper gas supply line 58$a$ is slightly smaller than the diameter of the lower gas supply line 58$b$.

An insulating sleeve 80 extending along a sidewall 14A of the base 14 is provided in the lower gas supply line 58$b$. In other words, the insulating sleeve 80 is accommodated in the second through-hole of the base 14. The insulating sleeve 80 may be made of the same insulating material as that of the electrostatic chuck 50, e.g., an insulating material such as ceramic or the like. The insulating sleeve 80 has a tubular shape, and a substantially cylindrical member is used in the present embodiment. An inner diameter R4 of the insulating sleeve 80 may be equal to the diameter R1 of the first through-hole. An outer diameter R3 of the insulating sleeve 80 may be equal to or smaller than the diameter R2 of the second through-hole. A length in an axial direction of the insulating sleeve 80 is substantially equal to the thickness of the base 14. On the bottom surface of the electrostatic chuck 50, one end of the insulating sleeve 80 is bonded by the second adhesive 72 to the peripheral portion of the upper gas supply line 58$a$. At this time, one end of the insulating sleeve 80 may be disposed such that an axis line M3 of the insulating sleeve 80 and the axis line M1 (central axis) of the first through-hole coincide with each other, i.e., the insulating sleeve 80 and the first through-hole are coaxially arranged.

The second adhesive 72 has higher resistance to the plasma or the radicals in comparison to the first adhesive 71. Specifically, plasma wear resistance, radical (e.g., oxygen radicals) wear resistance, plasma permeability resistance and radical permeability resistance of the second adhesive 71 are substantially the same as those of ceramic. As for the second adhesive 72, it is possible to use, e.g., an inorganic adhesive including a ceramic material. As for the inorganic adhesive, it is possible to use, e.g., a material containing an inorganic oxide or an inorganic fluoride.

As shown in FIG. 2, when the outer diameter R3 of the insulating sleeve 80 is smaller than the diameter R2 of the second through-hole, a space G is defined by the insulating sleeve 80 and an inner wall of the second through-hole (the sidewall 14A of the base 14). In other words, the insulating sleeve 80 is spaced from the sidewall 14A of the base 14 (the inner wall of the second through-hole) by a predetermined distance. The size of the space G is determined by linear expansion coefficients of a material of the insulating sleeve 80 and a material of the base 14, and a processing temperature. For example, in the case of using the base 14 made of aluminum and the insulating sleeve 80 made of ceramic and setting the processing temperature to 150° C., a difference in deformation of about 0.3 mm occurs between the base 14 and the insulating sleeve 80 due to thermal expansion. In that case, the insulating sleeve 80 is spaced from the sidewall 14A of the base 14 by a distance of about 0.3 mm or above.

In the present embodiment, a sealant 73 may be provided between the sidewall 14A of the base 14 and the insulating sleeve 80, i.e., in the space G, as shown in FIG. 2. The first adhesive 71 is isolated from the atmosphere by the sealant 73 sealing the space G. In other words, the sealant 73 prevents the first adhesive 71 from being deteriorated by the contact with radicals which are introduced from the processing space S and move along the insulating sleeve 80.

While the sealant 73 is filled in the space G (i.e., before sealant 73 is cured), the sealant 73 has fluidity and thus can flow between the sidewall 14A of the base 14 and the insulating sleeve 80. Then, the sealant 73 is cured and remains between the sidewall 14A of the base 14 and the insulating sleeve 80. In this manner, the space between the sidewall 14A of the base 14 and the insulating sleeve 80, i.e., the space G, is sealed. The sealant 73 has higher elasticity in comparison to the second adhesive 72 even after the curing, and is deformed in response to the thermal expansion of the base 14 and the insulating sleeve 80. For example, the sealant 73 preferably has a viscosity of 20000 cps or less and a Young's modulus of 1 MPa or less after the curing. As for the sealant 73, an organic adhesive made of an acryl vinyl-based material, an acrylic acid ester-based material or a styrene butadiene rubber-based material is used, for example. As for the sealant 73, is also possible to use a thermosetting resin or a casting resin (i.e., injectable plastic or elastomer compound), elastomer or the like.

Figure 3:
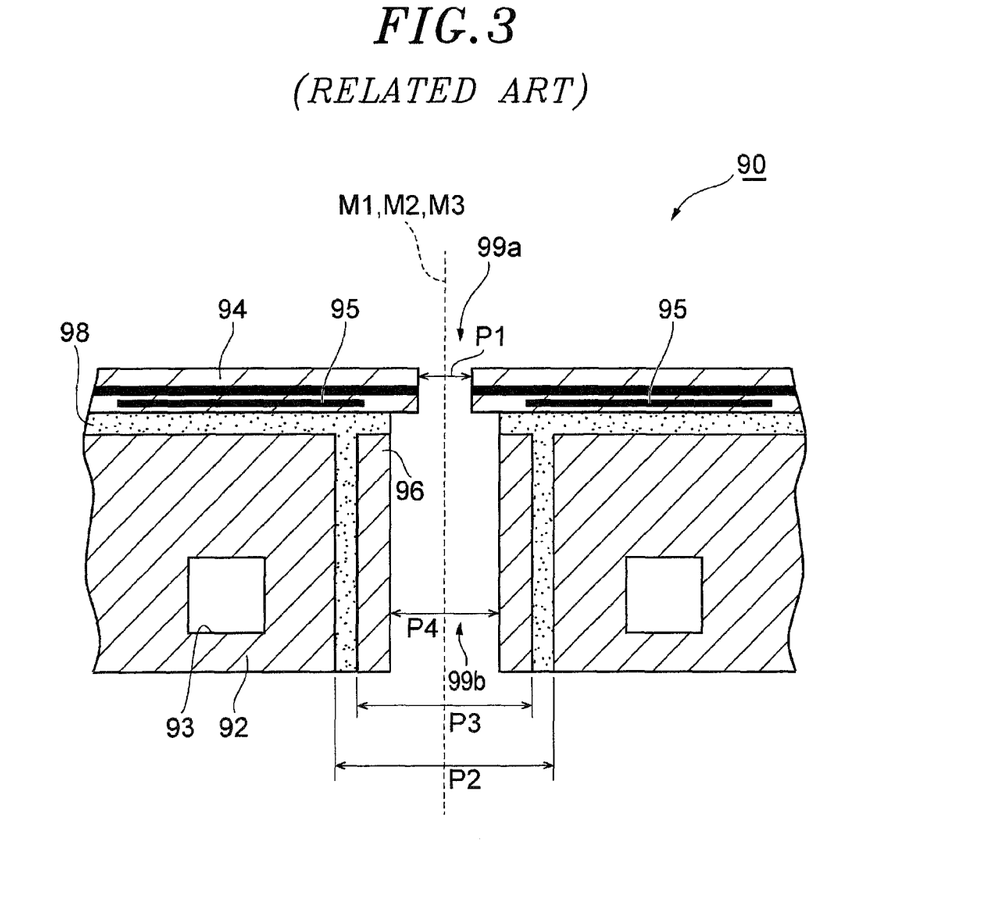
FIG. 3 shows a general structure of a conventional mounting table.

Next, an operation effect of the mounting table 70 of the present embodiment will be described. In order to explain the operation effect of the mounting table 70 of the present embodiment, a conventional mounting table 90 will be described first. FIG. 3 shows a general structure of the conventional mounting table. As shown in FIG. 3, the conventional mounting table 90 includes a base 92, an electrostatic chuck 94 and an insulating sleeve 96. The base 92, the electrostatic chuck 94 and the insulating sleeve 96 are adhered by an organic adhesive 98. A heater 95 as a heating device is buried in the electrostatic chuck 94. A coolant path 93 through which a coolant circulates is formed in the base 92. An upper gas supply line 99a penetrating through the electrostatic chuck 94 in the thickness direction thereof and a lower gas supply line 99b penetrating through the base 92 in the thickness direction thereof are formed in the mounting table 90.

A through-hole with a diameter P1 is formed in the electrostatic chuck 94 so as to penetrate therethrough in the thickness direction, thereby forming the upper gas supply line 99a. Meanwhile, a through-hole with a diameter P2 is formed in the base 92 so as to penetrate therethrough in the thickness direction, thereby forming the lower gas supply line 99b. The electrostatic chuck 94 and the base 92 are arranged such that the through-holes thereof communicate with each other. For example, the electrostatic chuck 94 and the base 92 are arranged such that an axis line M1 (central axis) of the through-hole with the diameter P1 and an axis line M2 (central axis) of the through-hole with the diameter P2 coincide with each other, i.e., such that the axis lines M1 and M2 are coaxially arranged. The diameter P1 of the upper gas supply line 99a is slightly smaller than the diameter P2 of the lower gas supply line 99b. An insulating sleeve 96 extending along the sidewall of the base 92 is provided in the lower gas supply line 99b. An inner diameter P4 of the insulating sleeve 96 is larger than the diameter P1, and an outer diameter P3 of the insulating sleeve 96 is smaller than the diameter P2. One end of the insulating sleeve 96 is disposed such that an axis line M3 of the insulating sleeve 96 and the axis line M1 (central axis) of the through-hole with the diameter P1 coincide with each other. In the mounting table 90, the organic adhesive 98 is exposed to the inside of the through-hole near the upper gas supply line 99a and a lower end portion of the insulating sleeve 96.

Figure 4:
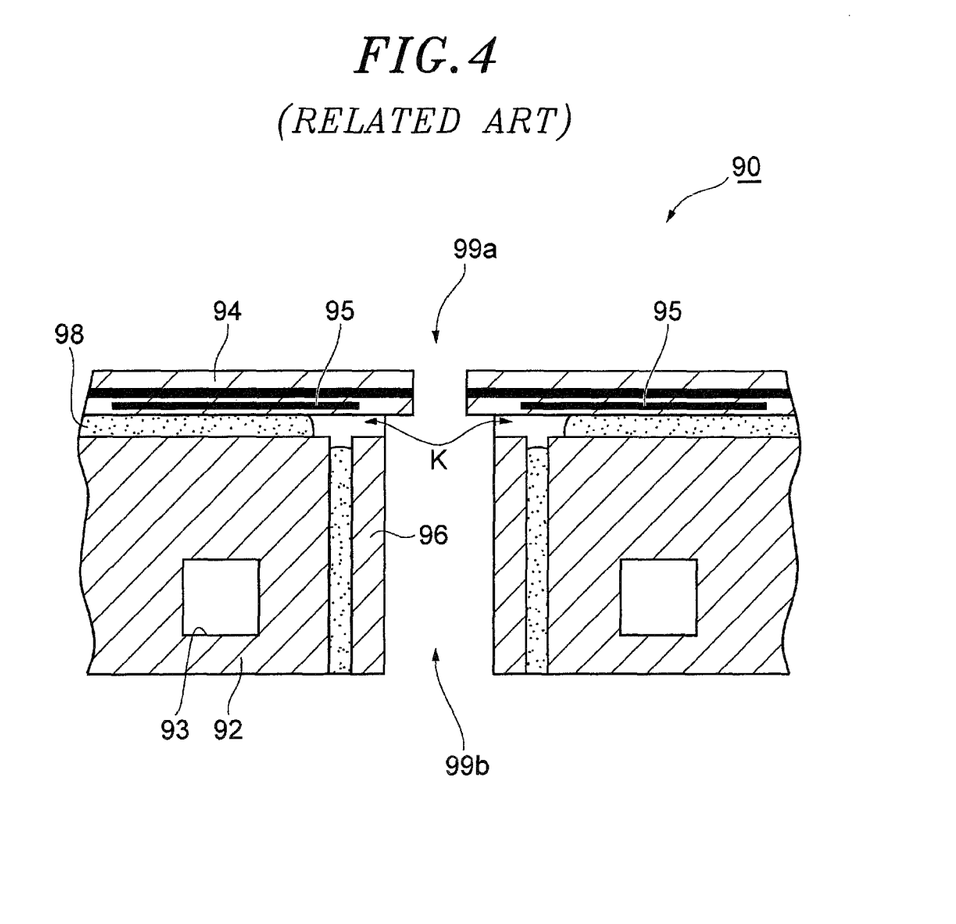
FIG. 4 shows a state in which an organic adhesive is worn in the conventional mounting table.

After the etching process is performed (generally for about 1 to 5 min), waferless dry cleaning for generating a plasma without a substrate to be processed W is carried out (generally for about 1 to 3 min) to remove by-products deposited on an inner wall of the processing chamber and a peripheral portion of the electrostatic chuck 94. At this time, the mounting table 90 is directly exposed to the plasma, and the plasma or the radicals are introduced into the through-hole. In the mounting table 90 having a structure in which the organic adhesive 98 is exposed to the inside of the through-hole, the organic adhesive 98 is damaged by the plasma or the radicals introduced into the through-hole. Especially, in a processing under a high-temperature environment, deterioration and wear of the organic adhesive 98 are facilitated. As shown in FIG. 4, if the organic adhesive 98 is worn by damage due to the plasma or the radicals, a space (an adhesive wear region K) is generated between the base 14 and the electrostatic chuck 94. Accordingly, the movement of heat generated by the heater 95 to the coolant path 93 is disturbed. In an actual plasma processing, since a large amount of heat input from the plasma space moves toward the coolant path 93, a local temperature increase caused by the disturbance of heat transfer to the adhesive wear region K becomes remarkable.

Figure 5:
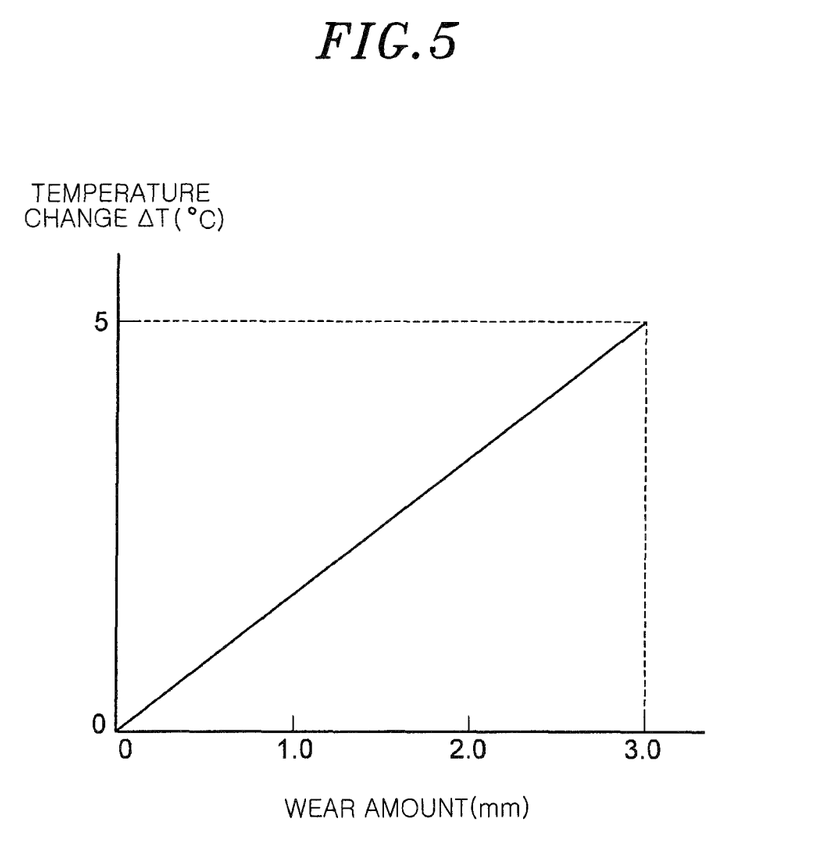
FIG. 5 is a graph showing relationship between wear of the organic adhesive and a temperature change $\Delta T$ of an electrostatic chuck.

FIG. 5 is a graph showing relationship between a wear amount of the organic adhesive 98 and a temperature change ΔT of the electrostatic chuck 94 in the case of using a silicon adhesive as the organic adhesive 98. In the graph of FIG. 5, the horizontal axis indicates the wear amount of the organic adhesive 98 in a diametrical direction of the electrostatic chuck 94, and the vertical axis indicates the temperature change ΔT of the electrostatic chuck 94. The wear amount is measured by a distance from an inner wall of the insulating sleeve 96 to a periphery of the organic adhesive 98 in the diametrical direction of the electrostatic chuck 94. As shown in FIG. 5, as the organic adhesive 98 is worn, the temperature of the electrostatic chuck 94 is increased. Specifically, when the organic adhesive 98 is worn by 3.0 mm, the temperature of the electrostatic chuck is increased by 5° C. This is because the amount of heat radiated from the base 92 is decreased by the decrease in the heat conduction from the electrostatic chuck 94 to the base 92 due to the wear of the organic adhesive 98.

Figure 6A:
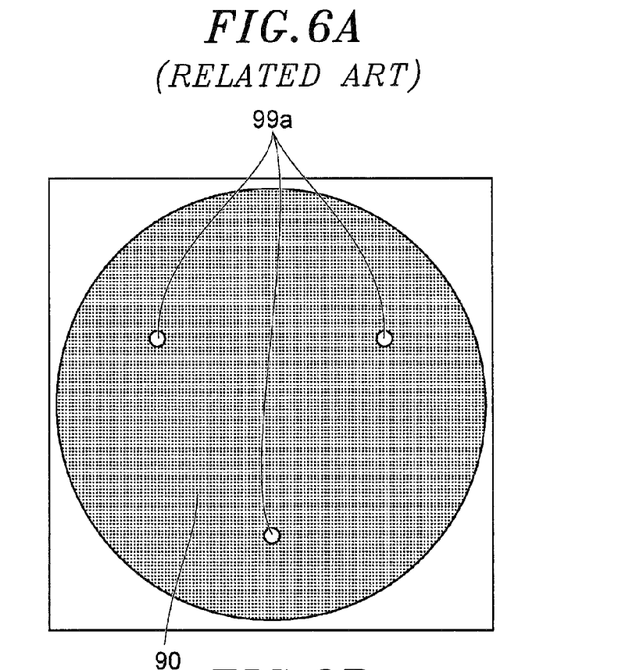
FIGS. 6A and 6B show temperature distributions of the electrostatic chuck in the case of performing dry etching by a plasma processing apparatus including the conventional mounting table.
Figure 6B:
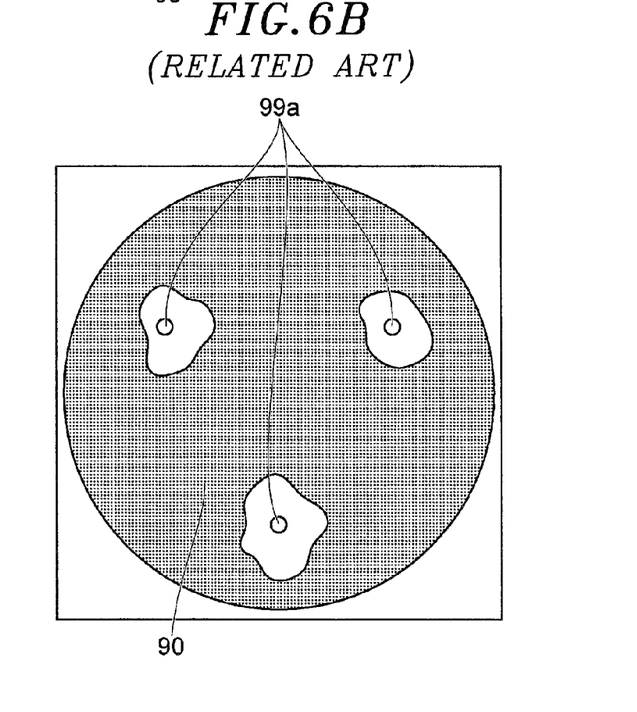

FIGS. 6A and 6B schematically show temperature distributions of the electrostatic chuck 94 in the case where the heater 95 was heated under process heating conditions. As for the organic adhesive 98, a silicon adhesive was used. FIG. 6A shows temperature distribution of the electrostatic chuck 94 in the case of using an unused mounting table 90. FIG. 6B shows temperature distribution of the electrostatic chuck 94 in the case of using a mounting table 90 that has been subjected to plasma processing including waferless dry cleaning for 120 hours in total.

As shown in FIG. 6B, in the case of heating the heater 95 in the mounting table 90 directly exposed to the plasma for 120 hours in total, the temperature of the electrostatic chuck 94 was increased at peripheral portions of the upper gas supply lines 99a, compared to the case of heating the heater 95 in the unused mounting table 90 as shown in FIG. 6A. This is because the organic adhesives 98 disposed at the peripheral portions of the upper gas supply lines 99a were worn by exposure to the plasma and the radicals introduced from the processing space S through the upper gas supply lines 99a, which resulted in formation of the adhesive wear region K. In this manner, in the plasma processing apparatus using the conventional mounting table 90, the cooling efficiency around the through-holes may be decreased as the plasma processing apparatus is used.

On the other hand, in the mounting table 70 of the present embodiment, the insulating sleeve 80 is provided in the through-hole penetrating through the base 14 and the electrostatic chuck 50 in such a way that it is spaced apart from the sidewall 14A of the base 14. The insulating sleeve 80 is bonded to the bottom surface of the electrostatic chuck 50 by the second adhesive 72 having higher resistance to the plasma or the radicals in comparison to the first adhesive 71. In other words, the insulating sleeve 80 is disposed at an inner position in the through-hole than the sidewall 14A of the base 14, so that the plasma or the radicals introduced through the through-hole are blocked by the insulating sleeve 80. As a consequence, the first adhesive 71 is prevented from being directly exposed to the plasma or the radicals. Further, since the second adhesive 72 used for the insulating sleeve 80 has higher resistance to the plasma or the radicals, the deterioration of the second adhesive 72 due to the plasma or the radicals becomes small. Accordingly, the mounting table 70 of the present embodiment can suppress deterioration of the first and the second adhesive 71 and 72. The deterioration of the first and the second adhesive 71 and 72 can be properly suppressed even in a processing under a high temperature environment (e.g., 150° C. or above).

The mounting table 70 of the present embodiment further includes a sealant 73 provided between the sidewall 14A of the base 14 and the insulating sleeve 80. Therefore, the sealant 73 can block radicals that have been introduced into the space between the sidewall 14A of the base 14 and the insulating sleeve 80 after moving around the insulating sleeve 80. As a result, the deterioration of the first adhesive 71 by the radicals can be reliably prevented.

In the mounting table 70 of the present embodiment, the first adhesive 71 is not exposed to the plasma or the radicals due to the presence of the sealant 73. Accordingly, the first adhesive 71 does not need a resistance to the plasma or the radicals. In other words, in the mounting table 70 of the present embodiment, it is not necessary to select a material of the adhesive in consideration of the resistance to the plasma or the radicals. Therefore, the degree of freedom in selecting the material of the first adhesive 71 can be increased. In other words, a material having other excellent physical properties (adhesive strength, elasticity, thermal conductivity, or volume resistivity) may be employed for the first adhesive 71 regardless of the resistance to the plasma or the radicals. In the case of employing a material having excellent elasticity for the first adhesive 71, design tolerance for thermal expansion of the mounting table 70 can be increased.

In the mounting table 70 of the present embodiment, the sealant 73 flows between the sidewall 14A of the base 14 and the insulating sleeve 80 and then is cured to seal the gap between the sidewall 14A of the base 14 and the insulating sleeve 80. Accordingly, the sealant 73 can be easily filled in the gap between the sidewall 14A of the base 14 and the insulating sleeve 80. Even when the sealant 73 is worn by the effect of the radicals, the sealant 73 can be easily filled in the gap again.

In the mounting table 70 of the present embodiment, the sealant 73 is an adhesive having a viscosity of 20000 cps or less before the curing and a Young's modulus of 1 MPa or less after the curing. Therefore, the sealant 73 can be easily filled in the gap between the sidewall 14A of the base 14 and the insulating sleeve 80 before the curing. After the curing, the sealant 73 can reliably remain in the gap between the sidewall 14A of the base 14 and the insulating sleeve 80 by being deformed in response to the thermal expansion of the base 14 and the insulating sleeve 80.

The plasma processing apparatus 10 of the present embodiment includes the mounting table 70 capable of preventing deterioration of the first adhesive 71, and thus can stably operate. Further, a long life span of the plasma processing apparatus 10 can be ensured.

The present invention is not limited to the above-described embodiment. For example, in the above-described embodiment, the sealant 73, the insulating sleeve 80 and the like are provided in the gas supply line 58 that is a through-hole for supplying a heat transfer gas to the gap between the top surface of the electrostatic chuck 50 and the substrate W. Alternatively, the sealant 73, the insulating sleeve 80 and the like may be provided in the gas supply line 60. In addition, the sealant 73, the insulating sleeve 80 and the like may be provided in a through-hole different from the gas supply lines 58 and 60. For example, the sealant 73, the insulating sleeve 80 and the like may be provided in a through-hole through which a lift pin for raising the substrate W from the mounting table 70 is inserted.

In the above embodiment, a length of the insulating sleeve 80 is substantially equal to a thickness of the base 14. However, the length of the insulating sleeve 80 may vary. For example, the length of the insulating sleeve 80 may be longer than an inflow depth of the plasma introduced from the processing space S.

DESCRIPTION OF REFERENCE NUMERALS

10: plasma processing apparatus
12: processing chamber
14: base
14A: sidewall
15: coolant path
50: electrostatic chuck
52: electrode
53: heater
54a, 54b: insulating film
56: DC power supply
58: gas supply line
58a: upper gas supply line
58b: lower gas supply line
60: gas supply line
62: heat transfer gas supply unit
64: heat transfer gas supply unit
66: control unit
70: mounting table
71: first adhesive
72: second adhesive
73: sealant
80: insulating sleeve (sleeve)
S: processing space
W: substrate to be processed (substrate)

What is claimed is:

1. A mounting table comprising:
   an electrostatic chuck having a top surface to be exposed to a plasma and a bottom surface opposite to the top surface, the electrostatic chuck including a first through-hole formed therethrough;
   a base bonded to the bottom surface of the electrostatic chuck by a first adhesive, the base including a second through-hole formed therethrough, the second through-hole communicating with the first through-hole and having a diameter larger than a diameter of the first through-hole; and
   a tubular sleeve,
   wherein the sleeve is bonded to the bottom surface of the electrostatic chuck by a second adhesive while communicating with the first through-hole,
   wherein the second adhesive has a higher resistance to the plasma or radicals than that of the first adhesive,
   wherein the first adhesive is an organic adhesive including a silicon-based material, an acrylic-based or acrylate-based material, or a polyimide silica-based material,
   wherein the second adhesive is an inorganic adhesive including a ceramic material, and
   wherein the sleeve is spaced apart from an inner wall of the second through-hole.

2. The mounting table of claim 1, wherein the sleeve has an inner diameter equal to the diameter of the first through-hole and is bonded to the bottom surface of the electrostatic chuck so as to be coaxial with the first through-hole.

3. The mounting table of claim 1, wherein the first adhesive is provided only at a contact portion between the electrostatic chuck and the base.

4. The mounting table of claim 1, wherein the sleeve has an outer diameter smaller than the second through-hole.

5. The mounting table of claim 4, further comprising a sealant filled in a space defined by the sleeve and the second through-hole.

6. The mounting table of claim 5, wherein the sealant is filled in the space by flowing into the space and then being cured.

7. The mounting table of claim 6, wherein the sealant has a viscosity of 20000 cps or less before curing and a Young's Modulus of 1 MPa or less after the curing.

8. The mounting table of claim 1, wherein the sleeve is made of the same insulating material as an insulating material of the electrostatic chuck.

9. The mounting table of claim 8, wherein the sleeve is made of ceramic.

10. The mounting table of claim 5, wherein the sealant is formed to isolate the first adhesive from an atmosphere.

11. The mounting table of claim 1, further comprising a sealant filled in a space between the inner wall of the second through-hole and the sleeve, wherein the sealant isolates the first adhesive from both the first through hole and the second through hole.

12. A plasma processing apparatus comprising:
a processing chamber including therein a processing space in which a plasma is to be generated;
a gas supply unit configured to supply a processing gas into the processing space;
a first electrode provided in the processing space;
a mounting table, accommodated in the processing chamber, for mounting thereon a substrate,
wherein the mounting table includes:
an electrostatic chuck having a top surface to be exposed to a plasma and a bottom surface opposite to the top surface, the electrostatic chuck including a first through-hole formed therethrough;
a base bonded to the bottom surface of the electrostatic chuck by a first adhesive, the base including a second through-hole formed therethrough, the second through-hole communicating with the first through-hole and having a diameter larger than a diameter of the first through-hole; and
a tubular sleeve,
wherein the base serves as a second electrode, and
wherein the sleeve is bonded to the bottom surface of the electrostatic chuck by a second adhesive while communicating with the first through-hole,
wherein the second adhesive has a higher resistance to the plasma or radicals than that of the first adhesive,
wherein the first adhesive is an organic adhesive including a silicon-based material, an acrylic-based or acrylate-based material, or a polyimide silica-based material,
wherein the second adhesive is an inorganic adhesive including a ceramic material, and
wherein the sleeve is spaced apart from an inner wall of the second through-hole.

\* \* \* \* \*